(12) United States Patent
Bouche et al.

(10) Patent No.: US 9,779,943 B2
(45) Date of Patent: Oct. 3, 2017

(54) COMPENSATING FOR LITHOGRAPHIC LIMITATIONS IN FABRICATING SEMICONDUCTOR INTERCONNECT STRUCTURES

(71) Applicant: GLOBALFOUNDRIES Inc., Grand Cayman (KY)

(72) Inventors: Guillaume Bouche, Albany, NY (US); Jason Eugene Stephens, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/053,818

(22) Filed: Feb. 25, 2016

(65) Prior Publication Data

US 2017/0250080 A1     Aug. 31, 2017

(51) Int. Cl.
| | |
|---|---|
| *H01L 21/4763* | (2006.01) |
| *H01L 21/033* | (2006.01) |
| *H01L 21/768* | (2006.01) |
| *H01L 23/528* | (2006.01) |
| *H01L 23/522* | (2006.01) |
| *H01L 23/532* | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76816* (2013.01); *H01L 21/76879* (2013.01); *H01L 23/5226* (2013.01); *H01L 23/5283* (2013.01); *H01L 23/53209* (2013.01); *H01L 23/53228* (2013.01)

(58) Field of Classification Search
CPC ............. H01L 21/0332; H01L 21/0335; H01L 21/0337; H01L 21/0338; H01L 21/76805; H01L 21/7684; H01L 21/76844; H01L 21/31144; H01L 21/76816; H01L 21/76879; H01L 23/5226; H01L 23/5283; H01L 23/53228
See application file for complete search history.

(56) References Cited

U.S. PATENT DOCUMENTS

| | | | |
|---|---|---|---|
| 6,455,436 B1 * | 9/2002 | Ueda | H01L 21/31144 |
| | | | 257/E21.257 |
| 8,298,943 B1 | 10/2012 | Arnold | |
| 8,999,848 B2 | 4/2015 | Lee et al. | |
| 9,012,287 B2 | 4/2015 | Liaw | |
| 9,123,656 B1 | 9/2015 | Hsieh et al. | |
| 9,209,279 B1 | 12/2015 | Zhang | |
| 9,406,775 B1 | 8/2016 | Bouche et al. | |
| 2013/0244344 A1 | 9/2013 | Malmhall | |
| 2013/0329486 A1 | 12/2013 | Juengling | |
| 2014/0054534 A1 | 2/2014 | Pellizzer | |

(Continued)

OTHER PUBLICATIONS

U.S. Appl. No. 15/077,480, filed Mar. 22, 2016.

(Continued)

*Primary Examiner* — Thanh T Nguyen
(74) *Attorney, Agent, or Firm* — Wayne F. Reinke, Esq.; Heslin Rothenberg Farley & Mesiti P.C.

(57) ABSTRACT

A hard mask is formed into lines and bridges two adjacent lines using mandrels, spacers for the mandrels and a lithographic process for each bridge to create a metal line pattern in a layer of an interconnect structure with a line pitch below lithographic resolution.

15 Claims, 6 Drawing Sheets

(56) References Cited

U.S. PATENT DOCUMENTS

| | | |
|---|---|---|
| 2014/0170853 A1 | 6/2014 | Shamma |
| 2014/0258961 A1 | 9/2014 | Ke |
| 2014/0273464 A1 | 9/2014 | Shieh |
| 2015/0072527 A1 | 3/2015 | Ng |
| 2015/0087149 A1 | 3/2015 | He |
| 2015/0140811 A1 | 5/2015 | Huang |
| 2015/0147882 A1 | 5/2015 | Yao |
| 2015/0318173 A1 | 11/2015 | Shih |
| 2015/0339422 A1* | 11/2015 | Greco ............ G06F 17/5068 438/702 |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee |
| 2016/0086841 A1 | 3/2016 | Song |
| 2016/0099178 A1 | 4/2016 | Zhang |
| 2016/0254191 A1 | 9/2016 | Tseng |
| 2016/0300757 A1* | 10/2016 | Dash ............ H01L 21/76831 |

OTHER PUBLICATIONS

U.S. Appl. No. 15/077,564, filed Mar. 22, 2016.
U.S. Appl. No. 15/077,384, filed Mar. 22, 2016.
U.S. Appl. No. 15/141,087, filed Apr. 28, 2016.
U.S. Appl. No. 15/271,475, filed Sep. 21, 2016.
U.S. Appl. No. 15/271,497, filed Sep. 21, 2016.
U.S. Appl. No. 15/271,519, filed Sep. 21, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
Non-Final Office Action, U.S. Appl. No. 15/141,087 dated Sep. 9, 2016.
Non-Final Office Action, U.S. Appl. No. 15/077,564 dated Oct. 18, 2016.
Non-Final Office Action, U.S. Appl. No. 15/077,384 dated Oct. 24, 2016.
U.S. Appl. No. 15/362,035, filed Nov. 28, 2016.
Final Office Action, U.S. Appl. No. 15/077,384 dated Feb. 28, 2017.
Non-Final Office Action, U.S. Appl. No. 15/077,480 dated Mar. 30, 2017.
Final Office Action, U.S. Appl. No. 15/077,564 dated Feb. 21, 2017.
Final Office Action, U.S. Appl. No. 15/141,087 dated Feb. 17, 2017.
Notice of Allowance, U.S. Appl. No. 15/077,384 dated Mar. 24, 2017.
Notice of Allowance, U.S. Appl. No. 15/077,564 dated Apr. 28, 2017.
Notice of Allowance, U.S. Appl. No. 15/141,087 dated Mar. 23, 2017.

* cited by examiner

COMPENSATING FOR LITHOGRAPHIC LIMITATIONS IN FABRICATING SEMICONDUCTOR INTERCONNECT STRUCTURES

BACKGROUND OF THE INVENTION

Technical Field

The present invention generally relates to interconnect structures for semiconductor devices. More particularly, the present invention relates to realizing a metal line pitch lower than lithographic resolution and reducing or eliminating unwanted line cuts.

Background Information

As semiconductor devices continue to shrink, the resolution obtainable with lithography limits its accuracy. For example, when cutting lines with a pitch of less than the lithographic resolution, current lithography tools may also cut lines adjacent to the line of interest.

Thus, a need exists for a way to compensate for the limitations of current lithographic tools.

SUMMARY OF THE INVENTION

The shortcomings of the prior art are overcome and additional advantages are provided through the provision, in one aspect, a method of forming an interconnect structure. The method includes forming a metal line pattern for an interconnect structure at a pitch below lithographic resolution, and forming at least one bridge between portions of adjacent metal lines, the at least one bridge being metal and situated perpendicular to the adjacent metal lines.

In accordance with another aspect, a semiconductor structure is provided. The semiconductor structure includes at least two metal lines in a metallization layer of an interconnect structure, the at least two metal lines being oriented in a first direction and having a pitch below 44 nm, and at least one metal bridge between the at least two metal lines in a second direction perpendicular to the first direction.

In accordance with yet another aspect, a semiconductor structure is provided. The semiconductor structure includes at least two metal lines in a metallization layer of an interconnect structure, the at least two metal lines being oriented in a first direction and having a pitch below a minimum lithographic resolution, and at least one metal bridge between the at least two metal lines in a second direction perpendicular to the first direction.

These, and other objects, features and advantages of this invention will become apparent from the following detailed description of the various aspects of the invention taken in conjunction with the accompanying drawings.

BRIEF DESCRIPTION OF THE DRAWINGS

FIG. 1 is a perspective view of one example of an interconnect structure in process for one or more semiconductor devices (shown generically as a layer), the interconnect structure in process including a bottom metal layer, a dielectric stack above the bottom metal layer and a hard mask stack above the dielectric stack, the hard mask stack including top and bottom layers of a first hard mask material and a middle hard mask layer of a second different hard mask material between the top and bottom hard mask layers, in accordance with one or more aspects of the present invention.

FIG. 2 depicts one example of the interconnect structure in process of FIG. 1 after forming a mandrel layer above the hard mask stack and forming a lithographic stack above the mandrel layer, the lithographic stack including a patterned layer of lithographic blocking material, in accordance with one or more aspects of the present invention.

FIG. 3 depicts one example of the structure of FIG. 2 after patterning mandrels in the mandrel layer, in accordance with one or more aspects of the present invention.

FIG. 4 depicts one example of the structure of FIG. 3 after forming spacers on each side of the mandrels, in accordance with one or more aspects of the present invention.

FIG. 5 is a top-down perspective view of one example of the structure of FIG. 4 after removing exposed portions of the top hard mask layer, exposing the middle hard mask layer between the spacers, in accordance with one or more aspects of the present invention.

FIG. 6 depicts one example of the structure of FIG. 5 after forming lithographic stack similar to the lithographic stack of FIG. 2, except that a bottom layer of the stack fills in the area between the spacers and a top layer of lithographic blocking material protects or preserves a portion of the middle hard mask layer of the lithographic stack, in accordance with one or more aspects of the present invention.

FIG. 7 is a top-down perspective view of one example of the structure of FIG. 6 after removing exposed portions of the middle layer shown in FIG. 5, except for a bridge, corresponding to the top layer of lithographic blocking material, in accordance with one or more aspects of the present invention.

FIG. 8 depicts one example of the structure of FIG. 7 after filling open areas with a filler material up to a top surface of the mandrels, exposing the mandrels, in accordance with one or more aspects of the present invention.

FIG. 9 depicts one example of the structure of FIG. 8 after removing the mandrels, which exposes the top hard mask layer, and removal thereof, in accordance with one or more aspects of the present invention.

FIG. 10 depicts one example of the structure of FIG. 9 after forming a lithographic stack, a top layer of lithographic blocking material protecting or preserving a portion of the middle hard mask layer, in accordance with one or more aspects of the present invention.

FIG. 11 is a top-down perspective view of one example of the structure of FIG. 10 after removing the lithographic stack and unprotected portions of the middle hard mask layer, in accordance with one or more aspects of the present invention.

FIG. 12 depicts one example of the structure of FIG. 11 after removing the spacers and filler material, exposing a portion and the top and bottom layers of hard mask material, in accordance with one or more aspects of the present invention.

FIG. 13 depicts one example of the structure of FIG. 12 after removing remaining portions of the top hard mask layer and exposed portions of the bottom hard mask layer, exposing the middle layer of hard mask material and a top layer of the dielectric stack, in accordance with one or more aspects of the present invention.

FIG. 14 depicts one example of the structure of FIG. 13 after forming trenches in the top two layers of the dielectric stack.

FIG. 15 depicts one example of the structure of FIG. 14 after overfilling the trenches with metal (e.g., copper and/or cobalt).

FIG. 16 depicts one example of the structure of FIG. 15 after planarization (e.g., a chemical-mechanical polishing process) down to the middle layer of the dielectric stack, thereby forming an interconnect metal layer.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a perspective view of one example of an interconnect structure 100 in process for one or more semiconductor devices (shown generically as layer 101), the interconnect structure in process including a bottom metal layer 102, a dielectric stack 104 above the bottom metal layer and a hard mask stack 106 above the dielectric stack, the hard mask stack including top 108 and bottom 110 layers of a first hard mask material and a middle hard mask layer 112 of a second different hard mask material between the top and bottom layers, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

FIG. 2 depicts one example of the interconnect structure 100 in process of FIG. 1 after forming a mandrel layer 114 above the hard mask stack 106 and forming a lithographic stack 116 above the mandrel layer, the lithographic stack including a patterned layer 118 of lithographic blocking material, in accordance with one or more aspects of the present invention.

In one example, the material of the mandrel layer includes, for example, a low-temperature amorphous silicon. In general, the operating temperature for the mandrel material should be acceptable for the back-end-of-the-line (BEOL), currently about 400° C. or lower. In one example, the lithographic stack 116 may include, for example, a bottom layer of amorphous carbon, a layer of silicon oxynitride (SiON) above the amorphous carbon, a layer of BARC material (bottom anti-reflective coating) over the SiON, and photoresist on top.

FIG. 3 depicts one example of the structure of FIG. 2 after patterning mandrels 120 in the mandrel layer (114, FIG. 2), in accordance with one or more aspects of the present invention. In one example, the lithography pattern is etched using, for example, Reactive Ion Etching into the mandrel layer.

FIG. 4 depicts one example of the structure of FIG. 3 after forming spacers 122 on each side of the mandrels 120, in accordance with one or more aspects of the present invention. In one example, the material of the spacers may include, for example, silicon dioxide. The spacer layer may be, for example, blanket and conformable, and the spacers formed by removing, anisotropically, portions of the spacer layer.

FIG. 5 is a top-down perspective view of one example of the structure of FIG. 4 after selectively removing exposed portions (124 and 126, FIG. 4) of the top hard mask layer 108, exposing the middle hard mask layer 112 between the spacers 122, in accordance with one or more aspects of the present invention.

FIG. 6 depicts one example of the structure of FIG. 5 after forming lithographic stack 128 similar to the lithographic stack 116 of FIG. 2, except that bottom layer 130 of the stack fills in the area (127, FIG. 5) between spacers 122, and top layer 132 of lithographic blocking material protects or preserves a portion 134 of the middle hard mask layer of the lithographic stack (see FIG. 7), in accordance with one or more aspects of the present invention.

FIG. 7 is a top-down perspective view of one example of the structure of FIG. 6 after removing exposed portions of the middle layer shown in FIG. 5, except for bridge 134, corresponding to the top layer (132, FIG. 6) of lithographic blocking material, in accordance with one or more aspects of the present invention.

FIG. 8 depicts one example of the structure of FIG. 7 after filling open areas (135, FIG. 7) with a filler material 137 (e.g., silicon dioxide) up to a top surface (e.g., top surface 136) of the mandrels 120, exposing the mandrels, in accordance with one or more aspects of the present invention. In one example, the open areas may be over-filled with the filler material and planarized down to the mandrels using, for example, a chemical-mechanical polishing process (CMP).

FIG. 9 depicts one example of the structure of FIG. 8 after removing the mandrels (120, FIG. 8), which exposes top hard mask layer 108, and removal thereof, in accordance with one or more aspects of the present invention. In one example, the mandrels may be removed using, for example, a wet or dry selective etch process.

FIG. 10 depicts one example of the structure of FIG. 9 after forming lithographic stack 138 similar to those used previously, including top layer 140 of lithographic blocking material protecting or preserving a portion (139, FIG. 11) of the middle hard mask layer 112, in accordance with one or more aspects of the present invention.

FIG. 11 is a top-down perspective view of one example of the structure of FIG. 10 after removing the lithographic stack (138, FIG. 10) and unprotected portions of the middle hard mask layer (112, FIG. 9), in accordance with one or more aspects of the present invention.

FIG. 12 depicts one example of the structure of FIG. 11 after removing the spacers (122, FIG. 4) and filler material (137, FIG. 8), exposing portion 139 and top 108 and bottom 110 layers of hard mask material, in accordance with one or more aspects of the present invention.

FIG. 13 depicts one example of the structure of FIG. 12 after removing remaining portions (142, FIG. 12) of top hard mask layer 108 and exposed portions (144, FIG. 12) of bottom hard mask layer 110, exposing middle layer 112 of hard mask material and top layer 146 of dielectric stack 104, in accordance with one or more aspects of the present invention.

Subsequently, the middle 112 and bottom 110 hard mask layers (or just the bottom hard mask layer) are used to etch trenches below for filling with metal to form an interconnect metal layer.

FIG. 14 depicts one example of the structure of FIG. 13 after forming trenches 147 in the top two layers 148 of dielectric stack 104.

Figure 2:
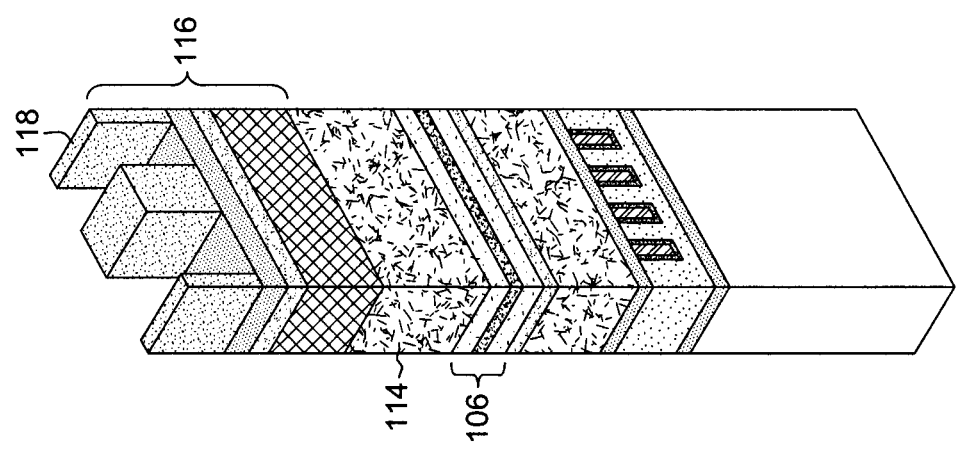
Figure 1:
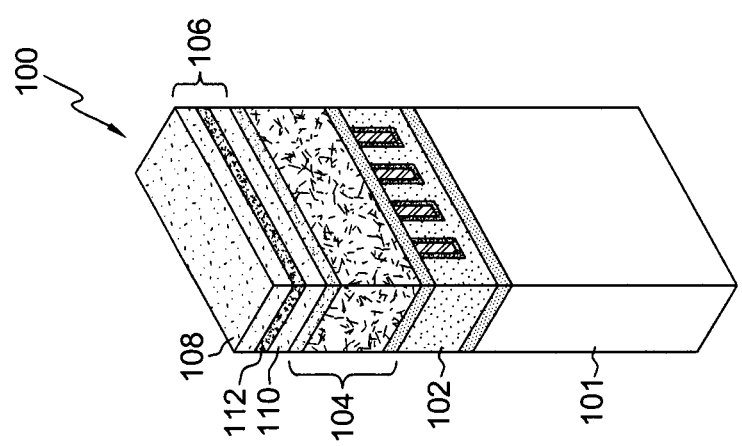
Figure 5:
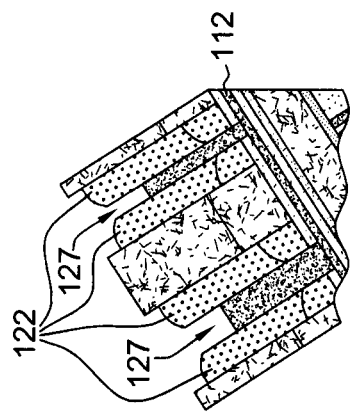
Figure 4:
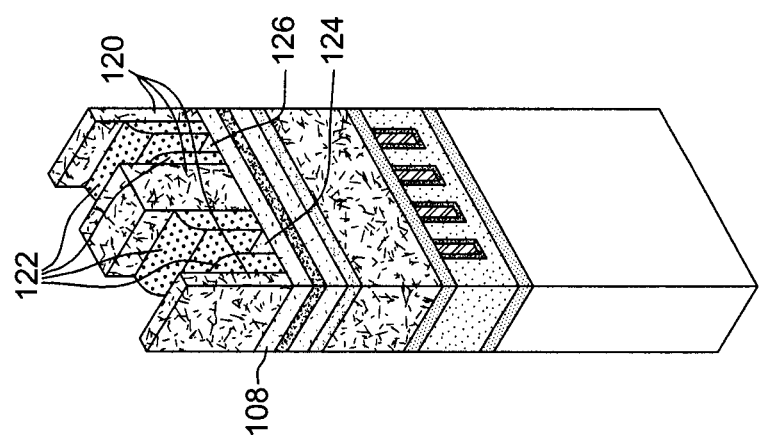
Figure 3:
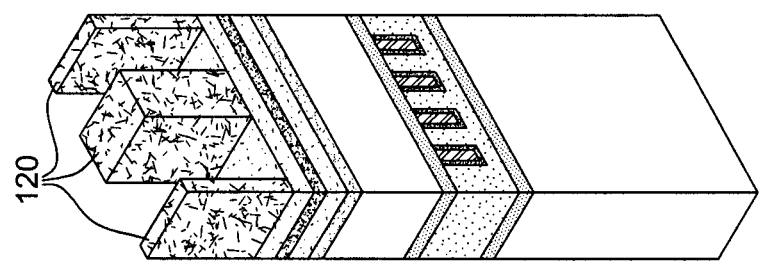
Figure 8:
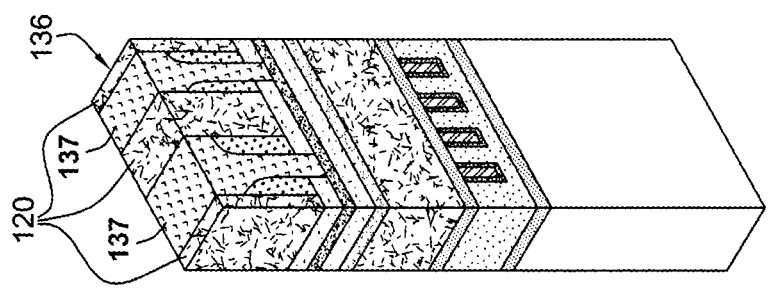
Figure 7:
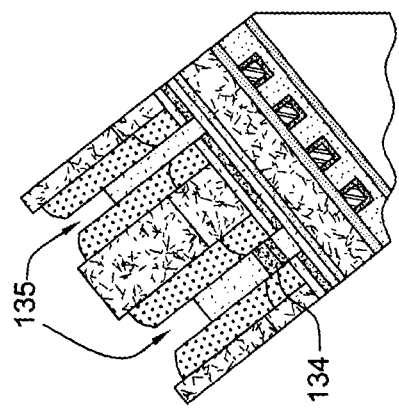
Figure 6:
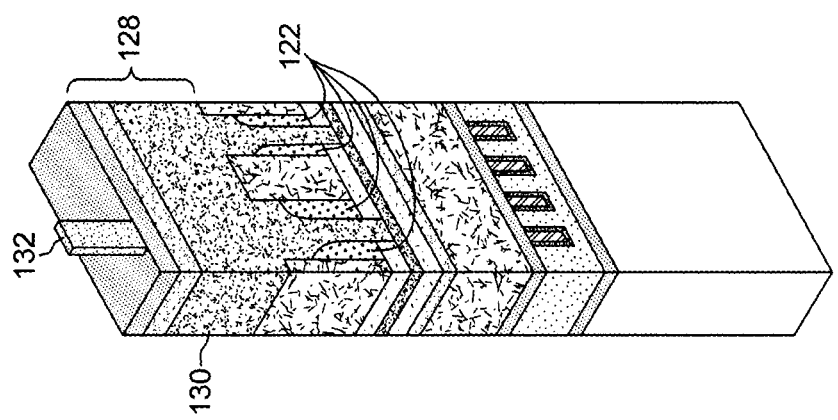
Figure 11:
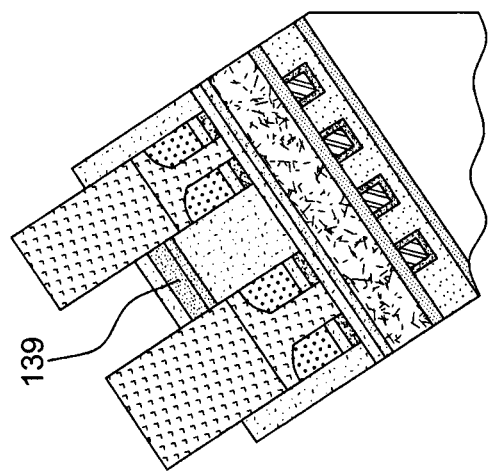
Figure 10:
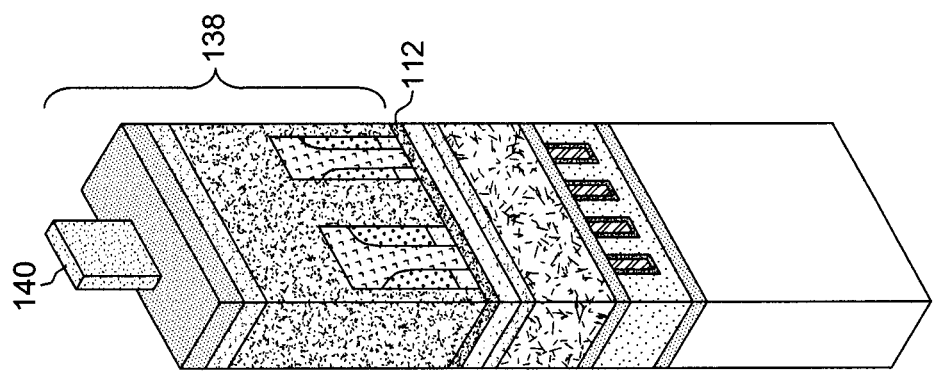
Figure 9:
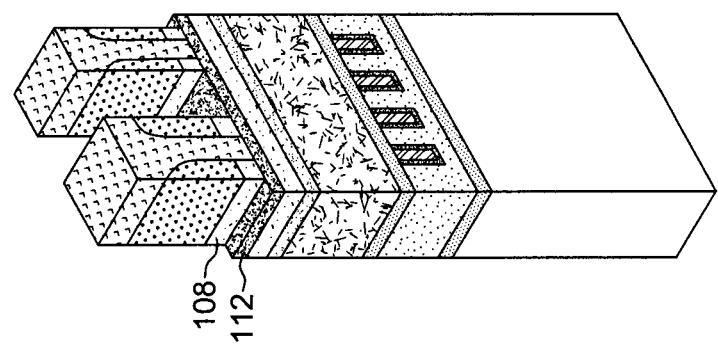
Figure 13:
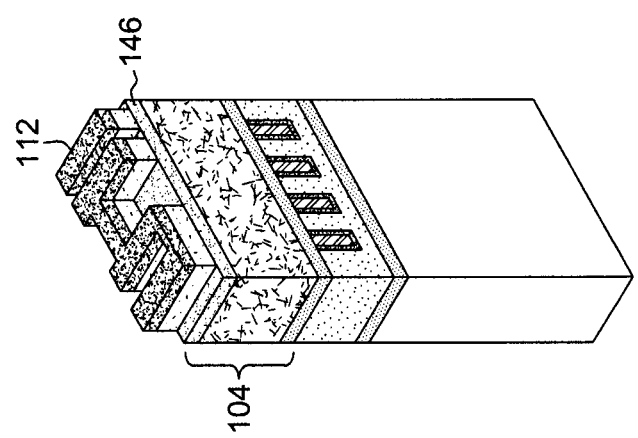
Figure 12:
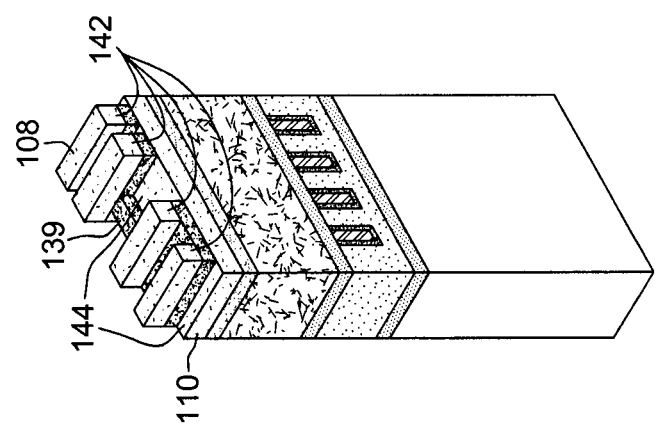
Figure 16:
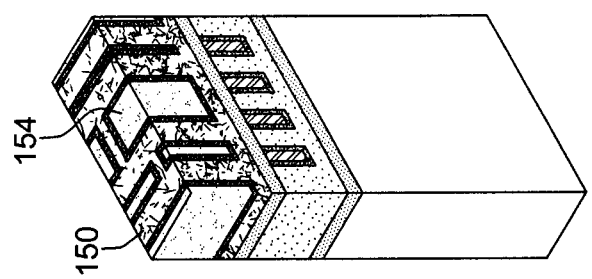
FIG. 16 depicts one example of the structure of FIG. 15 after planarization (e.g., a chemical-mechanical polishing process) down to the middle layer 150 of the dielectric stack (104, FIG. 14), thereby forming an interconnect metal layer 154.
Figure 15:
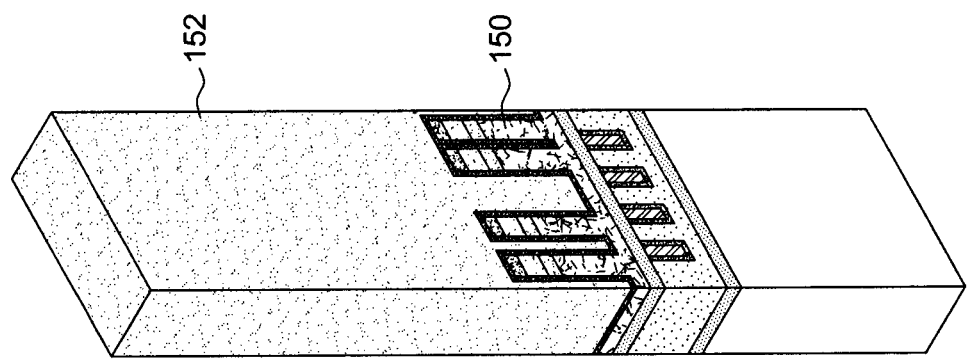
FIG. 15 depicts one example of the structure of FIG. 14 after overfilling the trenches 147 with metal 152 (e.g., copper and/or cobalt).
Figure 14:
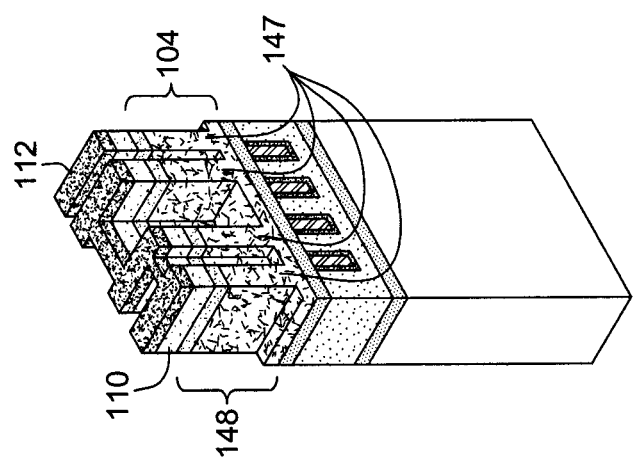

In a first aspect, disclosed above is a method. The method includes forming a metal line pattern for an interconnect structure at a pitch below lithographic resolution (currently about 44 nm), and forming bridge(s) between portions of adjacent metal lines, the bridge(s) being perpendicular to the adjacent metal lines.

In one example, the metal line pattern and bridge(s) are formed from a tri-layer hard mask stack. In one example, the tri-layer hard mask stack may include, for example, a layer of silicon nitride between two layers of titanium nitride.

In one example, the method may further include, for example, forming mandrels, and forming spacers adjacent the mandrels. In one example, forming the mandrels may include, for example, using lithography and etching to remove portions of a mandrel layer over the tri-layer hard mask stack.

In one example, forming the spacers may include, for example, forming a conformal blanket dielectric layer over the mandrels, and removing portions of the conformal blanket dielectric layer. In one example, forming the conformal blanket dielectric layer may include, for example, using an atomic layer deposition process.

In one example, where the mandrels and spacers are present, the method may further include, for example, removing portions of a top hard mask layer of the tri-layer hard mask stack situated in opening(s) between the spacers. In one example, the method may further include, for example, removing exposed portions of a middle hard mask layer of the tri-layer hard mask stack while preserving portion(s) perpendicular to a direction of the opening(s). In one example, the removing while preserving may include, for example, using lithography.

In one example, where the removing while preserving aspect is performed, the method may further include, for example, forming a filler material layer in the opening(s) up to a top surface of the mandrels. In one example, where the filler material layer is present, the method may further include, for example, removing the mandrels, and removing portions of the top hard mask layer exposed by removing the mandrels. In one example, the method may further include, for example, removing exposed portions of the middle hard mask layer of the tri-layer hard mask stack while preserving portion(s) thereof in an X-direction. In one example, the removing while preserving may include, for example, using lithography.

In one example, where the removing while preserving aspect is present, the method may further include, for example, removing the spacers and the filler material layer, removing remaining portions of the top hard mask layer of the tri-layer hard mask stack, and removing exposed portions of a bottom hard mask layer of the tri-layer hard mask stack In a second aspect, disclosed above is a semiconductor structure. The semiconductor structure includes multiple metal lines in a metallization layer of an interconnect structure, the multiple metal lines being oriented in a first direction and having a pitch below 44 nm, and metal bridge(s) between the multiple metal lines in a second direction perpendicular to the first direction. In one example, the metal lines include copper and/or cobalt.

In a third aspect, disclosed above is a semiconductor structure. The semiconductor structure includes multiple metal lines in a metallization layer of an interconnect structure, the multiple metal lines being oriented in a first direction and having a pitch below a minimum lithographic resolution, and metal bridge(s) between the multiple metal lines in a second direction perpendicular to the first direction. In one example, the metal lines include copper and/or cobalt.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
    forming a metal line pattern for an interconnect structure at a pitch below lithographic resolution; and
    forming at least one bridge between portions of adjacent metal lines, the at least one bridge being metal and situated perpendicular to the adjacent metal lines.

2. The method of claim 1, wherein the metal line pattern and at least one bridge are formed from a tri-layer hard mask stack.

3. The method of claim 2, wherein the tri-layer hard mask stack comprises a layer of silicon nitride between two layers of titanium nitride.

4. The method of claim 2, further comprising:
    forming mandrels from a mandrel layer situated above the tri-layer hard mask stack; and
    forming spacers adjacent the mandrels.

5. The method of claim 4, wherein forming the mandrels comprises using lithography and etching to remove portions of a mandrel layer over the tri-layer hard mask stack.

6. The method of claim 4, wherein forming the spacers comprises:
    forming a conformal blanket dielectric layer over the mandrels; and
    removing portions of the conformal blanket dielectric layer.

7. The method of claim 6, wherein forming the conformal blanket dielectric layer comprises using an atomic layer deposition process.

8. The method of claim 4, further comprising removing portions of a top hard mask layer of the tri-layer hard mask stack situated in at least one opening between the spacers.

9. The method of claim 8, further comprising removing exposed portions of a middle hard mask layer of the tri-layer hard mask stack while preserving at least one portion perpendicular to a direction of the at least one opening.

10. The method of claim 9, wherein the removing while preserving comprises using lithography.

11. The method of claim 9, further comprising forming a filler material layer in the at least one opening and up to a top surface of the mandrels.

12. The method of claim 11, further comprising:
    removing the mandrels; and
    removing portions of the top hard mask layer exposed by removing the mandrels.

13. The method of claim 12, further comprising removing exposed portions of the middle hard mask layer of the tri-layer hard mask stack while preserving at least one portion thereof in an X-direction.

14. The method of claim 13, wherein the removing while preserving comprises using lithography.

15. The method of claim 13, further comprising:
    removing the spacers and filler material layer;
    removing remaining portions of the top hard mask layer of the tri-layer hard mask stack; and
    removing exposed portions of a bottom hard mask layer of the tri-layer hard mask stack.

* * * * *